(12) United States Patent
Kim et al.

(10) Patent No.: US 12,185,588 B2
(45) Date of Patent: Dec. 31, 2024

(54) DISPLAY DEVICE

(71) Applicant: Samsung Display Co., Ltd., Yongin-Si (KR)

(72) Inventors: Ji Yoon Kim, Seongnam-si (KR); Yool Guk Kim, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 399 days.

(21) Appl. No.: 17/326,262

(22) Filed: May 20, 2021

(65) Prior Publication Data

US 2022/0130921 A1 Apr. 28, 2022

(30) Foreign Application Priority Data

Oct. 22, 2020 (KR) .......................... 10-2020-0137711

(51) Int. Cl.
| | |
|---|---|
| *H01L 27/12* | (2006.01) |
| *H10K 50/84* | (2023.01) |
| *H10K 50/842* | (2023.01) |
| *H10K 59/122* | (2023.01) |
| *H10K 59/88* | (2023.01) |

(52) U.S. Cl.
CPC ....... *H10K 59/122* (2023.02); *H10K 50/8428* (2023.02); *H10K 50/846* (2023.02); *H10K 59/88* (2023.02)

(58) Field of Classification Search
CPC ............. H01L 27/3246; H01L 27/3223; H01L 51/525; H01L 27/3276
See application file for complete search history.

(56) References Cited

U.S. PATENT DOCUMENTS

| | | | |
|---|---|---|---|
| 10,153,333 B1* | 12/2018 | Li | ......................... H10K 71/191 |
| 2015/0171366 A1 | 6/2015 | Kim | |
| 2016/0202400 A1* | 7/2016 | Lee | ......................... G02B 5/223 |
| | | | 257/40 |
| 2016/0372535 A1* | 12/2016 | Lee | ......................... H10K 59/88 |
| 2018/0374909 A1* | 12/2018 | Nishikiori | ............ H10K 59/122 |

(Continued)

FOREIGN PATENT DOCUMENTS

| | | |
|---|---|---|
| KR | 10-0658291 B1 | 12/2006 |
| KR | 10-0714011 B1 | 5/2007 |

(Continued)

*Primary Examiner* — Vu A Vu
*Assistant Examiner* — Valerie N Newton
(74) *Attorney, Agent, or Firm* — Innovation Counsel LLP

(57) ABSTRACT

A display device according to an embodiment includes: a substrate including a display area, a dummy area, and a peripheral area; a passivation layer positioned in the display area, the dummy region, and the peripheral area of the substrate; a first adhesive auxiliary layer positioned on the passivation layer and positioned in the dummy region; a dummy pixel defining layer positioned on the first adhesive auxiliary layer and including a hydrophobic material; a second adhesive auxiliary layer positioned on the passivation layer, positioned in the peripheral area, and including a lateral side contacting the dummy pixel defining layer; a common voltage transmitter positioned in the peripheral area; and a common electrode connected to the common voltage transmitter, and positioned on the second adhesive auxiliary layer and the dummy pixel defining layer.

22 Claims, 13 Drawing Sheets

(56) References Cited

U.S. PATENT DOCUMENTS

| | | | |
|---|---|---|---|
| 2019/0229177 A1* | 7/2019 | Kim | G09G 3/3233 |
| 2020/0013834 A1* | 1/2020 | Park | H10K 59/88 |
| 2020/0106045 A1* | 4/2020 | Han | H10K 59/65 |
| 2022/0208907 A1* | 6/2022 | Ryu | H01L 27/3276 |

FOREIGN PATENT DOCUMENTS

| | | |
|---|---|---|
| KR | 10-2020-0042063 A | 4/2020 |
| KR | 10-2020-0049943 A | 5/2020 |

* cited by examiner

DISPLAY DEVICE

CROSS-REFERENCE TO RELATED APPLICATION

This application claims priority to and the benefit of Korean Patent Application No. 10-2020-0137711 filed in the Korean Intellectual Property Office on Oct. 22, 2020, the entire contents of which are incorporated herein by reference.

BACKGROUND

1. Field

The present disclosure relates to display devices.

2. Discussion

A display device displays images on a screen. Types of display devices include liquid crystal displays (LCD's) and organic light emitting diode (OLED) displays. The display devices are used in various electronic devices such as portable phones, GPS devices, digital cameras, electronic books, portable game devices, and various terminals.

The display device may be formed by stacking a plurality of layers and patterning the layers by various methods. For example, these methods include a photo and etching process, a chemical mechanical grinding process, and an inkjet printing process.

The inkjet printing process forms a predetermined pattern by discharging fine droplets of an ink to a desired position. For example, an emission layer of an OLED display may be formed using an inkjet printing process. The OLED display may include a plurality of pixels in which the pixels may be distinguished by a pixel defining layer and the emission layer may be formed by discharging droplets in an opening of the pixel defining layer. To prevent the discharged droplets from flowing outside the opening of the pixel defining layer, the pixel defining layer may include a hydrophobic material.

When the pixel defining layer includes the hydrophobic material, adherence with another layer contacting the pixel defining layer may be reduced. For example, a reduced adherence of the pixel defining layer to an insulating layer may cause the pixel defining layer to separate from the insulating layer.

SUMMARY

An embodiment provides a display device including: a substrate including a display area, a dummy area, and a peripheral area; a passivation layer positioned in the display area, the dummy region, and the peripheral area of the substrate; a first adhesive auxiliary layer positioned on the passivation layer and positioned in the dummy region; a dummy pixel defining layer positioned on the first adhesive auxiliary layer and including a hydrophobic material; a second adhesive auxiliary layer positioned on the passivation layer, positioned in the peripheral area, and including a lateral side contacting the dummy pixel defining layer; a common voltage transmitter positioned in the peripheral area; and a common electrode electrically connected to the common voltage transmitter, and positioned on the second adhesive auxiliary layer and the dummy pixel defining layer.

The second adhesive auxiliary layer may be made of a positive photoresist, and the dummy pixel defining layer may be made of a negative photoresist.

The dummy pixel defining layer may be positioned on the lateral side of the second adhesive auxiliary layer and may not be positioned on an upper side of the second adhesive auxiliary layer.

The dummy pixel defining layer may overlap an edge of an upper side of the second adhesive auxiliary layer.

An overlapping width of the dummy pixel defining layer and the second adhesive auxiliary layer may be equal to or greater than 2 μm.

The display device may further include: an encapsulation substrate facing the substrate; and a spacer positioned between the substrate and the encapsulation substrate, wherein the second adhesive auxiliary layer may include the same material as the spacer.

The second adhesive auxiliary layer may be positioned on a same layer as the spacer, and the second adhesive auxiliary layer may be formed by a same process as the spacer.

The display device may further include: a transistor positioned in a display area of the substrate; and a pixel electrode connected to the transistor and positioned in the display area, wherein the first adhesive auxiliary layer include a same material as the pixel electrode, and the first adhesive auxiliary layer extends to the peripheral area and is positioned below the second adhesive auxiliary layer.

The first adhesive auxiliary layer may be positioned on the same layer as the pixel electrode, and first adhesive auxiliary layer may be formed by a same process as the pixel electrode.

The display device may further include a pixel defining layer positioned on the pixel electrode and the passivation layer and including a pixel opening, wherein the dummy pixel defining layer may include a same material as the pixel defining layer.

The display device may further include an emission layer positioned in the pixel opening, wherein the dummy emission layer may include a same material as the emission layer.

The emission layer may be formed by a same inkjet printing process as the dummy emission layer.

The transistor may include: a semiconductor positioned on the substrate; a gate electrode overlapping the semiconductor; and a source electrode and a drain electrode positioned on the gate electrode and connected to the semiconductor, and the common voltage transmitter may include a same material as the source electrode and the drain electrode.

The common electrode may be positioned on a lateral side of the passivation layer and the lateral side of the second adhesive auxiliary layer.

The first adhesive auxiliary layer may include an inorganic insulating material.

The display device may further include: a transistor positioned in a display area of the substrate; and a pixel electrode connected to the transistor and positioned in the display area, wherein the first adhesive auxiliary layer extends to the display area and is positioned below the pixel electrode.

The passivation layer may include a first passivation layer and a second passivation layer positioned on the first passivation layer, the second adhesive auxiliary layer may be positioned on the first passivation layer, and the second adhesive auxiliary layer may be positioned on a same layer as the second passivation layer.

The display device may further include an encapsulation layer positioned on the common electrode.

The passivation layer may include a first portion and a second portion with different thicknesses, the first portion of the passivation layer may be thicker than the second portion, the second adhesive auxiliary layer may be positioned on a same layer as the passivation layer, and the dummy pixel defining layer may be positioned on an inclined side of a portion of the second adhesive auxiliary layer with a same thickness as the first portion of the passivation layer.

Another embodiment provides a display device including: a substrate including a display area, a dummy region, and a peripheral area; a transistor positioned in a display area of the substrate; a pixel electrode connected to the transistor and positioned in the display area; a passivation layer positioned between the transistor and the pixel electrode, and positioned in the display area, the dummy region, and the peripheral area; a pixel defining layer positioned on the pixel electrode and the passivation layer and including a pixel opening; an emission layer positioned in the pixel opening; a first adhesive auxiliary layer positioned on the passivation layer and positioned in the dummy region and the peripheral area; a dummy pixel defining layer positioned on the first adhesive auxiliary layer and including a dummy pixel opening; a dummy emission layer positioned in the dummy pixel opening; a second adhesive auxiliary layer positioned on the passivation layer and the first adhesive auxiliary layer and contacting the dummy pixel defining layer; a common voltage transmitter positioned in the peripheral area; and a common electrode connected to the common voltage transmitter, and positioned on the second adhesive auxiliary layer, the dummy pixel defining layer, the dummy emission layer, the pixel defining layer, and the emission layer.

The dummy pixel defining layer may include a hydrophobic material and may be made of a negative photoresist, and the second adhesive auxiliary layer may be made of a positive photoresist.

The display device further includes: an encapsulation substrate facing the substrate; and a spacer positioned between the substrate and the encapsulation substrate, wherein the second adhesive auxiliary layer may include a same material as the spacer, and the first adhesive auxiliary layer may include a same material as the pixel electrode.

According to the embodiments, the pixel defining layer may be prevented from lifting, and the metal layer positioned on the pixel defining layer may be prevented from being short-circuited.

DETAILED DESCRIPTION

Figure 1:
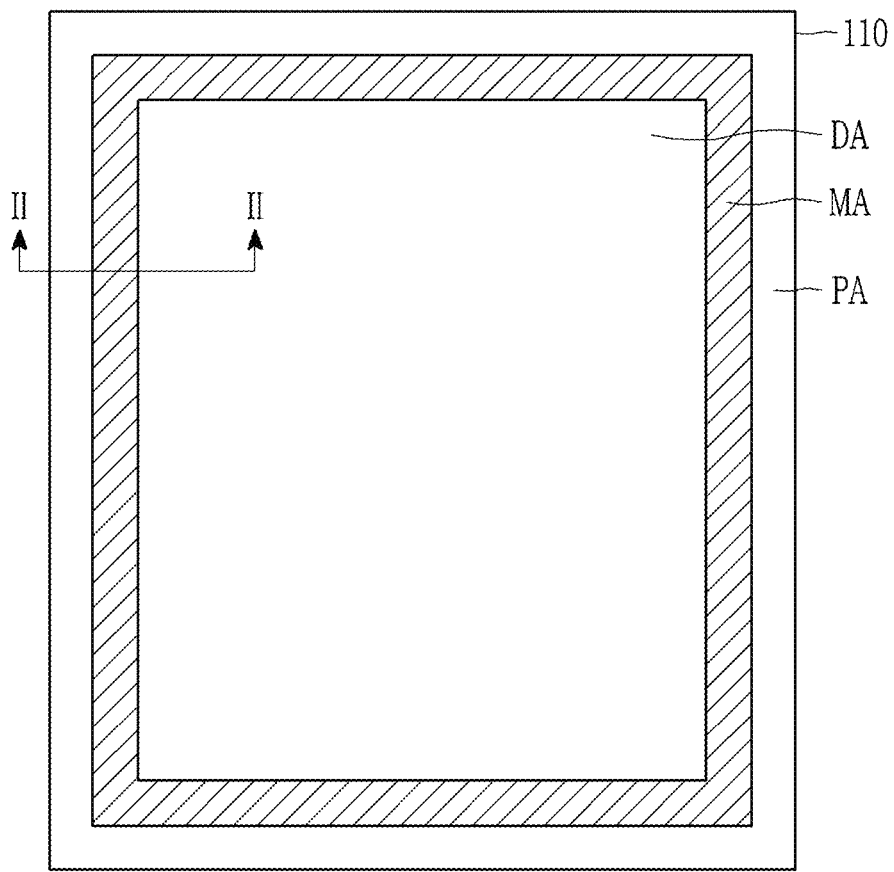
FIG. 1 shows a top plan view of a display device according to an embodiment.

The present invention will be described more fully hereinafter with reference to the accompanying drawings, in which embodiments of the invention are shown.

Parts that are irrelevant to the description will be omitted to clearly describe the present invention, and the same elements will be designated by the same reference numerals throughout the specification.

The size and thickness of each configuration shown in the drawings are arbitrarily shown for better understanding and ease of description, but the present invention is not limited thereto. The thickness of layers, films, panels, regions, etc. are exaggerated for clarity. The thicknesses of some layers and areas are exaggerated for convenience of explanation.

It will be understood that when an element such as a layer, film, region, or substrate is referred to as being "on" another element, it can be directly on the other element or intervening elements may also be present. In contrast, when an element is referred to as being "directly on" another element, there are no intervening elements present. The word "on" or "above" means positioned on or below the object portion, and does not necessarily mean positioned on the upper side of the object portion based on a gravitational direction.

Unless explicitly described to the contrary, the word "comprise" and variations such as "comprises" or "comprising" will be understood to imply the inclusion of stated elements but not the exclusion of any other elements.

The phrase "in a plan view" means viewing an object portion from the top, and the phrase "in a cross-sectional view" means viewing a cross-section of which the object portion is vertically cut from the side.

A display device according to an embodiment will now be described with reference to FIG. 1 and FIG. 2.

Figure 2:
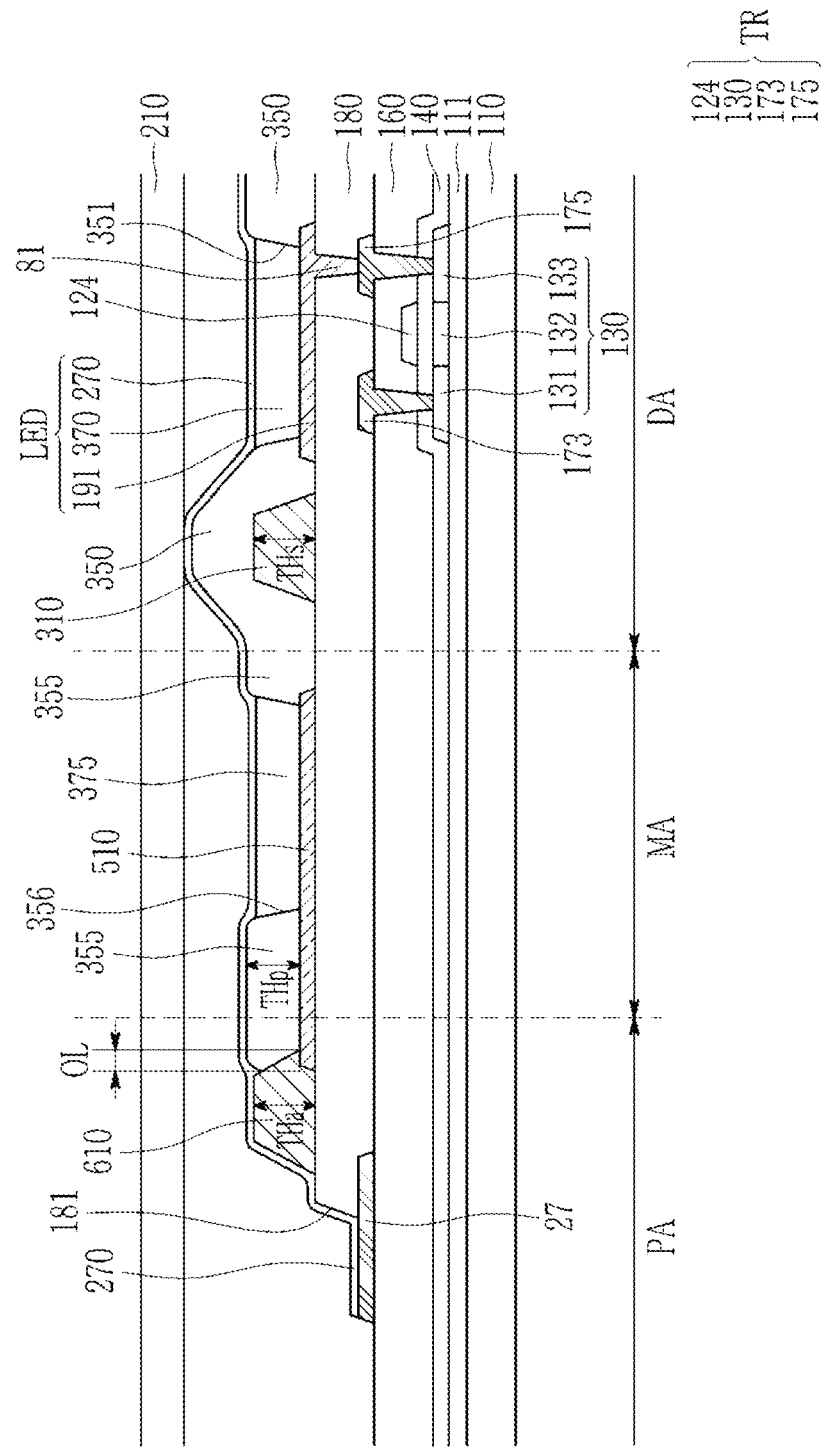
FIG. 2 shows a cross-sectional view of a display device according to an embodiment with respect to a line II-II of FIG. 1.

FIG. 1 shows a top plan view of a display device according to an embodiment, and FIG. 2 shows a cross-sectional view of a display device according to an embodiment with respect to a line II-II of FIG. 1.

As shown in FIG. 1, the display device includes a substrate 110.

The substrate 110 may include a display area (DA), a dummy area (MA) positioned outside the display area (DA), and a peripheral area (PA) positioned outside the dummy area (MA).

The display area (DA) includes a plurality of pixels (not shown) and displays images. A plurality of pixels including a transistor and a light emitting diode (LED) may be positioned in the display area (DA). The pixels may be arranged in various forms, for example, a matrix form.

The dummy area (MA) surrounds the display area (DA), dummy pixels (not shown) are positioned in the dummy area (MA), and no images are displayed by the dummy area (MA). However, a position of the dummy area (MA) is not limited thereto, and the dummy area (MA) may be positioned to surround part of the display area (DA). The dummy pixel may have a similar shape to the pixel positioned in the display area (DA). The dummy pixel may be the same as the pixel positioned in the display area (DA) or may be partly different therefrom. For example, the dummy pixel may not include the transistor (TR), but may include a light-emitting device (LED). In this instance, the dummy pixel may not emit light.

The peripheral area (PA) is positioned on the outer side to surround the display area (DA) and the dummy area (MA), and it displays no images. Signal lines for transmitting various signals for driving the pixels positioned in the display area (DA) may be positioned in the peripheral area (PA). A pad portion (not shown) may be positioned in the peripheral area (PA). Further, a flexible printed circuit board (not shown) may be attached to the peripheral area (PA) and may be electrically connected to the pad portion. The flexible printed circuit board may be electrically connected to the pad portion by an anisotropic conductive film. The flexible printed circuit board may include a driving integrated circuit and a driving signal output by the driving integrated circuit may be supplied to the respective pixels of the display area (DA) through the pad portion.

As shown in FIG. 2, a transistor (TR) including a semiconductor 130, a gate electrode 124, a source electrode 173, and a drain electrode 175, a pixel electrode 191 connected to the transistor (TR), and an emission layer 370 and a common electrode 270 positioned on the pixel electrode 191 may be positioned on the display area (DA) of the substrate 110 of the display device according to an embodiment. Here, the pixel electrode 191, the emission layer 370, and the common electrode 270 may configure a light-emitting device (LED).

The substrate 110 may include a rigid material that may not bend, such as glass, or a flexible material that may bend, such as plastic or polyimide.

The semiconductor 130 may be positioned on the substrate 110. The semiconductor 130 may include a semiconductor material such as amorphous silicon, polycrystalline silicon, or an oxide semiconductor. For example, the semiconductor 130 may include low temperature polysilicon (LTPS), or may include an oxide semiconductor material including at least one of zinc (Zn), indium (In), gallium (Ga), tin (Sn), and a mixture thereof. For another example, the semiconductor 130 may include an indium-gallium-zinc oxide (IGZO). The semiconductor 130 may include a source region 131, a channel region 132, and a drain region 133. The source region 131 and the drain region 133 may be positioned on respective sides of the channel region 132. The source region 131, the channel region 132, and the drain region 133 may be distinguished depending on whether an impurity is doped. The impurity may be doped to the source region 131 and the drain region 133 so they may have a conductive characteristic corresponding to a conductor. The impurity may not be doped to the channel region 132.

A buffer layer 111 may be positioned between the substrate 110 and the semiconductor 130. The buffer layer 111 may improve the characteristic of the semiconductor 130 by blocking the impurity from the substrate 110 in a process for forming a semiconductor 130, and it may ease a stress of the semiconductor 130 positioned on the buffer layer 111 by planarizing the substrate 110. The buffer layer 111 may be positioned in the dummy area (MA) and the peripheral area (PA) as well as in the display area (DA) of the substrate 110. The buffer layer 111 may include an inorganic insulating material such as a silicon nitride (SiNx), a silicon oxide (SiOx), or a silicon oxynitride (SiOxNy). The buffer layer may be a single layer or a multi-layered structure of the material.

Although not shown, a barrier layer may be further positioned between the substrate 110 and the buffer layer 111. The barrier layer may be positioned in the dummy area (MA) and the peripheral area (PA) as well as in the display area (DA) of the substrate 110. The barrier layer may include an inorganic insulating material, for example, a silicon nitride (SiNx), a silicon oxide (SiOx), or a silicon oxynitride (SiOxNy). The barrier layer may be a single or multi-layered structure of the material.

A gate insulating layer 140 may be positioned on the semiconductor 130. The gate insulating layer 140 may cover the semiconductor 130 and the substrate 110. The gate insulating layer 140 may be positioned in the dummy area (MA) and the peripheral area (PA) as well as in the display area (DA) of the substrate 110. The gate insulating layer 140 may include an inorganic insulating material such as a silicon nitride (SiNx), a silicon oxide (SiOx), or a silicon oxynitride (SiOxNy). The gate insulating layer 140 may be a single layer or multi-layered structure of the material.

The gate electrode 124 may be positioned on the gate insulating layer 140. The gate electrode 124 may include a metal such as copper (Cu), molybdenum (Mo), aluminum (Al), silver (Ag), chromium (Cr), tantalum (Ta), or titanium (Ti), or a metal alloy thereof. The gate electrode 124 may be configured with a single layer or a multilayer. A portion of the semiconductor 130 overlapping the gate electrode 124 may be the channel region 132.

An interlayer insulating layer 160 may be positioned on the gate electrode 124. The interlayer insulating layer 160 may cover the gate electrode 124 and the gate insulating layer 140. The interlayer insulating layer 160 may be positioned in the dummy area (MA) and the peripheral area (PA) as well as in the display area (DA) of the substrate 110. The interlayer insulating layer 160 may include an inorganic insulating material such as a silicon nitride (SiNx), a silicon oxide (SiOx), or a silicon oxynitride (SiOxNy). The interlayer insulating layer 160 may be a single layer or multi-layered structure of the material.

The source electrode 173 and the drain electrode 175 may be positioned on the interlayer insulating layer 160. The source electrode 173 and the drain electrode 175 may be connected to the semiconductor 130 by an opening formed in the interlayer insulating layer 160 and the gate insulating layer 140. The source electrode 173 may be connected to the source region 131 of the semiconductor 130. The drain electrode 175 may be connected to the drain region 133 of the semiconductor 130. Accordingly, the above-described semiconductor 130, the gate electrode 124, the source electrode 173, and the drain electrode 175 configure a transistor (TR). Depending on embodiments, the transistor (TR) may not include the source electrode 173 and the drain electrode 175 but may include a source region and a drain region of the semiconductor 130.

The source electrode 173 and the drain electrode 175 may include a metal such as aluminum (Al), copper (Cu), silver (Ag), gold (Au), platinum (Pt), palladium (Pd), nickel (Ni), molybdenum (Mo), tungsten (W), titanium (Ti), chromium (Cr), or tantalum (Ta), or a metal alloy thereof. The source electrode 173 and the drain electrode 175 may be made of a single layer or a multilayer.

A passivation layer 180 may be positioned on the source electrode 173 and the drain electrode 175. The passivation layer 180 may cover the source electrode 173, the drain electrode 175, and the interlayer insulating layer 160. The passivation layer 180 may be positioned in the dummy area (MA) and the peripheral area (PA) as well as in the display area (DA) of the substrate 110. The passivation layer 180 may be positioned in part of the peripheral area (PA) and may not be positioned in other parts thereof. The passivation layer 180 may planarize a surface of the substrate 110 on which the transistor (TR) is installed. The passivation layer 180 may be made of an organic insulator, and may include at least one material of polyimide, polyamide, acryl resin, benzocyclobutene, and phenol resin. The passivation layer 180 may be made of a positive photoresist.

The pixel electrode 191 may be positioned on the passivation layer 180. The pixel electrode 191 is also referred to as an anode, and may be configured with a single layer including a transparent conductive oxide layer and/or a metal material, or a multilayer including them. The transparent conductive oxide film may include an indium tin oxide (ITO), a poly-ITO, an indium zinc oxide (IZO), an indium gallium zinc oxide (IGZO), and an indium tin zinc oxide (ITZO). The metal material may include silver (Ag), molybdenum (Mo), copper (Cu), gold (Au), and aluminum (Al). For example, the pixel electrode 191 may be formed by stacking a metal material such as silver (Ag) or aluminum (Al) and a transparent conductive oxide film such as an indium tin oxide (ITO) by use of a sputter process. In this instance, the metal material may be formed to be about 100 nm thick, and the transparent conductive oxide film may be formed to be about 5 nm thick.

The passivation layer 180 may include a via-hole 81 (or an opening) overlapping the drain electrode 175. The drain electrode 175 may be physically and electrically connected to the pixel electrode 191 through the via-hole 81 of the passivation layer 180. Accordingly, the pixel electrode 191 may receive an output current that may be transmitted to the emission layer 370 from the drain electrode 175.

A spacer 310 may be positioned on the passivation layer 180. The spacer 310 may include an organic material such as polyimide, acryl resin, or an epoxy-based organic polymer. In this instance, the spacer 310 may be made of a positive photoresist.

A pixel defining layer 350 may be positioned on the pixel electrode 191. The pixel defining layer 350 may cover portions of the pixel electrode 191 and the passivation layer 180. In this instance, the pixel defining layer 350 may cover the edge of the pixel electrode 191. The pixel defining layer 350 may overlap the spacer 310. The pixel defining layer 350 may be formed to cover the spacer 310. The pixel defining layer 350 may include a pixel opening 351 for exposing part of an upper side of the pixel electrode 191. The pixel opening 351 may expose a central portion in the upper side of the pixel electrode 191. The pixel defining layer 350 may partition a formation position of the emission layer 370 so that the emission layer 370 may be positioned on an exposed portion on the upper side of the pixel electrode 191. The pixel defining layer 350 may include a polyimide-based organic polymer. Depending on embodiments, the pixel defining layer 350 may be made of a black pixel define layer (BPDL) including a black color pigment. The pixel defining layer 350 may include a hydrophobic material. Particularly, a liquid repellent component of the pixel defining layer 350 is moved to an upper surface so that the surface of the pixel defining layer 350 may display the liquid repellent characteristic. In this instance, the pixel defining layer 350 may be made of a negative photoresist.

The emission layer 370 may be positioned in the pixel opening 351 partitioned by the pixel defining layer 350. The emission layer 370 may include an organic material for emitting red, green, and blue light. The emission layer 370 for emitting red, green, and blue light may include a low-molecule or polymer organic material. FIG. 2 shows the emission layer 370 as a single layer, but auxiliary layers such as an electron injection layer, an electron transport layer, a hole transport layer, or a hole injection layer may be included at the top and bottom of the emission layer 370, where a hole injection layer and a hole transport layer may be positioned at the bottom of the emission layer 370, and an electron transport layer and an electron injection layer may be positioned at the top of the emission layer 370.

The common electrode 270 may be positioned on the pixel defining layer 350 and the emission layer 370. The common electrode 270 may be referred to as a cathode, and it may be configured with a single layer including a transparent conductive oxide film and/or a metal material or a multilayer including the same. The transparent conductive oxide film may include an indium tin oxide (ITO), an indium zinc oxide (IZO), an indium gallium zinc oxide (IGZO), and an indium tin zinc oxide (ITZO). The metal material may include Ag or AgMg. For example, the common electrode 270 may be made of Ag or AgMg that is about 10 nm thick. In this instance, the common electrode 270 may have a semi-transparent characteristic, and it may configure a microcavity together with the pixel electrode 191. According to the microcavity structure, light with a specific wavelength is output upward by a gap between respective electrodes, and as a result, red, green, or blue may be displayed.

An encapsulation substrate 210 may be positioned on the common electrode 270. The encapsulation substrate 210 may be positioned to face the substrate 110, and it may have a similar shape to the substrate 110. For example, the encapsulation substrate 210 and the substrate 110 may substantially have a rectangular shape. The encapsulation substrate 210 may have a similar size to the substrate 110, and the encapsulation substrate 210 may be smaller than the substrate 110. The encapsulation substrate 210 may be made of glass or plastic, and it may be made of a transparent material.

A gap between the substrate 110 and the encapsulation substrate 210 may be maintained by the spacer 310. A portion of the common electrode 270 overlapping the spacer 310 and the pixel defining layer 350 may contact the encapsulation substrate 210. However, without being limited thereto, the spacer 310 may not overlap the pixel defining layer 350. In this instance, the spacer 310 may become thicker, and a portion of the common electrode 270 overlapping the spacer 310 may contact the encapsulation substrate 210.

The buffer layer 111, the gate insulating layer 140, the interlayer insulating layer 160, and the passivation layer 180 may be stacked on the dummy area (MA) and the peripheral area (PA) of the substrate 110 of the display device according to an embodiment, as described above. It is, however, not limited thereto, and at least one of the layers may be omitted.

A first adhesive auxiliary layer 510 is positioned in the dummy area (MA) of the substrate 110 of the display device according to an embodiment. The first adhesive auxiliary layer 510 may extend to the peripheral area (PA). That is, the first adhesive auxiliary layer 510 may be positioned in the peripheral area (PA) of the substrate 110. The first adhesive auxiliary layer 510 may be positioned on the passivation layer 180. The first adhesive auxiliary layer 510 may include a same material as the pixel electrode 191. The first adhesive auxiliary layer 510 may be positioned on the same layer as the pixel electrode 191, and may be formed through the same process. The dummy area (MA) may include a plurality of dummy pixels, and the first adhesive auxiliary layer 510 may be positioned on a plurality of dummy pixels and may be positioned among a plurality of dummy pixels. That is, the first adhesive auxiliary layer 510 may not be separated for respective dummy pixels, but may be generally connected as a whole. It is, however, not limited thereto, and the first adhesive auxiliary layer 510 may be separately formed for the respective dummy pixels. In this instance, the first adhesive auxiliary layer 510 may have substantially the same shape as the pixel electrode 191. However, when the first adhesive auxiliary layer 510 has the totally connected shape, adherence between the passivation layer 180 and the dummy pixel defining layer 355 may be further improved.

A dummy pixel defining layer 355 may be positioned on the first adhesive auxiliary layer 510. The dummy pixel defining layer 355 may cover a portion of the first adhesive auxiliary layer 510. The dummy pixel defining layer 355 may include a dummy pixel opening 356 for exposing part of the upper side of the first adhesive auxiliary layer 510. The dummy pixel opening 356 may expose the central portion of the upper side of the first adhesive auxiliary layer 510. The dummy pixel defining layer 355 may partition of the formation position of the dummy emission layer 375 so that the dummy emission layer 375 may be positioned on the portion exposed on the upper side of the first adhesive auxiliary layer 510. The dummy pixel defining layer 355 may include the same material as the pixel defining layer 350. Therefore, the dummy pixel defining layer 355 may include an organic insulating material, and may include a hydrophobic material. The dummy pixel defining layer 355 may be positioned on the same layer as the pixel defining layer 350.

The dummy emission layer 375 may be positioned in the dummy pixel opening 356 partitioned by the dummy pixel defining layer 355. The dummy emission layer 375 may include an organic material for emitting red, green, and blue light in a like manner of the emission layer 370. The dummy emission layer 370 for emitting red, green, and blue light may include a low-molecule or polymer organic material. FIG. 2 shows the dummy emission layer 370 as a single layer, but auxiliary layers such as an electron injection layer, an electron transport layer, a hole transport layer, or a hole injection layer may be included at the top and bottom of the dummy emission layer 370, where a hole injection layer and a hole transport layer may be positioned at the bottom of the dummy emission layer 370, and an electron transport layer and an electron injection layer may be positioned at the top of the dummy emission layer 370.

The dummy emission layer 375 may include the same material as the emission layer 370. The dummy emission layer 375 may be positioned on the same layer as the emission layer 370, and may be formed by the same process. The emission layer 370 may be formed by using the inkjet printing process. A material for configuring the emission layer 370 is discharged to the pixel opening 351 of each pixel, and it is then dried to form the emission layer 370. In this instance, a drying speed of the central portion of the display area (DA) with a relatively high density of pixels may be different from a drying speed of an edge of the display area (DA) with a relatively low density of pixels. The central portion of the display area (DA) may be relatively quickly dried, and the edge of the display area (DA) may be relatively slowly dried. In the present embodiment, the dummy pixel may be positioned in the dummy area (MA), the dummy pixel opening 356 may be positioned for each dummy pixel, and the dummy emission layer 375 may be positioned in the dummy pixel opening 356. The dummy area (MA) may be positioned on respective edges of the display area (DA), and the inkjet printing process may be progressed toward an edge of another side of the display device from an edge of one side. As described above, the dummy areas (MA) are positioned on the respective sides of the display area (DA), and the dummy emission layer 375 is formed in the dummy area (MA), thereby reducing a difference of drying speeds between the central portion of the pixel area (DA) and the edge. That is, the drying speed of the emission layer 370 on the edge of the display area (DA) may become similar to the drying speed of the emission layer 370 on the central portion of the display area (DA) by performing the inkjet printing process to the dummy area (MA) that is near the edge of the display area (DA).

A common voltage transmitter 27 may be positioned on the peripheral area (PA) of the substrate 110 of the display device according to an embodiment. The common voltage transmitter 27 may be positioned on the interlayer insulating layer 160. The common voltage transmitter 27 may include the same material as the source electrode 173 and/or the drain electrode 175. The common voltage transmitter 27 may be positioned on the same layer as the source electrode 173 and/or the drain electrode 175. A common voltage (ELVSS) may be applied to the common voltage transmitter 27.

The passivation layer 180 may be positioned on the common voltage transmitter 27. At least part of the upper side of the common voltage transmitter 27 may be covered by the passivation layer 180. The passivation layer 180 may include an opening 181 overlapping the common voltage transmitter 27. At least part of the common voltage transmitter 27 may be exposed by the opening 181 of the passivation layer 180. That is, at least part of the upper side of the common voltage transmitter 27 may not be covered by the passivation layer 180.

The first adhesive auxiliary layer 510 may be positioned on the passivation layer 180, and a second adhesive auxiliary layer 610 may be positioned on the passivation layer 180 and the first adhesive auxiliary layer 510. The second adhesive auxiliary layer 610 may be positioned in the peripheral area (PA) of the substrate 110. The second adhesive auxiliary layer 610 may overlap at least part of the first adhesive auxiliary layer 510. The second adhesive auxiliary layer 610 is shown in FIG. 2 to partly overlap the first adhesive auxiliary layer 510, but is not limited thereto. The first adhesive auxiliary layer 510 may further extend to overlap the second adhesive auxiliary layer 610. That is, a bottom surface of the second adhesive auxiliary layer 610 may contact the first adhesive auxiliary layer 510. In this instance, the first adhesive auxiliary layer 510 made of a conductive material may be electrically connected to the common electrode 270. In this instance, the first adhesive auxiliary layer 510 is a floating electrode layer, and it may be short-circuited from the common electrode 270.

The second adhesive auxiliary layer 610 may include the same material as the spacer 310. The second adhesive auxiliary layer 610 may be positioned on the same layer as the spacer 310, and may be formed according to the same process. A thickness (THa) of the second adhesive auxiliary layer 610 may be close to a thickness (THp) of the dummy pixel defining layer 355. For example, the thickness (THa) of the second adhesive auxiliary layer 610 may be substantially the same as the thickness (THp) of the dummy pixel defining layer 355. Therefore, the upper side of the second adhesive auxiliary layer 610 and the upper side of the dummy pixel defining layer 355 may have the same height from the substrate 110. That is, the upper sides of the second adhesive auxiliary layer 610 and the dummy pixel defining layer 355 may be planarized. The thickness (THa) of the second adhesive auxiliary layer 610 may become close to the thickness (THs) of the spacer 310. For example, the thickness (THa) of the second adhesive auxiliary layer 610 may be substantially the same as the thickness (THs) of the spacer 310. It is, however, not limited thereto, and the thickness (THa) of the second adhesive auxiliary layer 610 may be different from the thickness (THs) of the spacer 310. For example, the thickness (THa) of the second adhesive auxiliary layer 610 may be less than the thickness (THs) of the spacer 310. In this instance, the second adhesive auxiliary layer 610 and the spacer 310 may be formed to have different thicknesses by using a halftone mask and a slit mask. For example, as thicknesses of respective layers, the thickness (THp) of the dummy pixel defining layer 355 may be about 1.2 μm, and the thickness (THs) of the spacer 310 and the thickness (THa) of the second adhesive auxiliary layer 610 may be about 1.5 to 1.8 μm. For another example, the thickness (THp) of the dummy pixel defining layer 355 may be about 1.2 μm, the thickness (THs) of the spacer 310 may be about 1.5 to 1.8 μm, and the thickness (THa) of the second adhesive auxiliary layer 610 may be about 1.0 μm.

The dummy pixel defining layer 355 may be positioned in the dummy area (MA) of the substrate 110 and also in the peripheral area (PA). The dummy pixel defining layer 355 may overlap the second adhesive auxiliary layer 610. In this instance, the dummy pixel defining layer 355 may be positioned on a lateral side of the second adhesive auxiliary layer 610, that is, on an inclined side, and it may be formed to cover the inclined side. An overlapping width OL of the dummy pixel defining layer 355 and the second adhesive auxiliary layer 610 may correspond to a horizontal width of the inclined side of the second adhesive auxiliary layer 610. For example, the overlapping width OL of the dummy pixel defining layer 355 and the second adhesive auxiliary layer 610 may be equal to or greater than about 2 μm. In this instance, the dummy pixel defining layer 355 may be formed to mostly cover the inclined side of the second adhesive auxiliary layer 610 and may be formed to not cover the upper side of the second adhesive auxiliary layer 610. Therefore, the upper side of the dummy pixel defining layer 355 and the upper side of the second adhesive auxiliary layer 610 may be made planar.

The common electrode 270 may be position in the pixel area (DA) of the substrate 110, and also in the dummy area (MA) and the peripheral area (PA). The common electrode 270 may be positioned on the dummy pixel defining layer 355, the dummy emission layer 375, the second adhesive auxiliary layer 610, the passivation layer 180, and the common voltage transmitter 27. The common electrode 270 may be positioned on the lateral side and the upper side of the passivation layer 180, it may be positioned on the lateral side and the upper side of the second adhesive auxiliary layer 610, and it may be positioned on the upper side of the dummy pixel defining layer 355. The passivation layer 180 and the second adhesive auxiliary layer 610 may be made of a positive photoresist. Therefore, the passivation layer 180 and the second adhesive auxiliary layer 610 may have a low taper angle, and it may prevent the common electrode 270 positioned on the lateral side of the passivation layer 180 and the second adhesive auxiliary layer 610 from being short-circuited. The dummy pixel defining layer 355 may be made of a negative photoresist. The dummy pixel defining layer 355 generally has a high taper angle, but in the present embodiment, the edge of the dummy pixel defining layer 355 is positioned on the inclined side of the second adhesive auxiliary layer 610, and the upper side of the dummy pixel defining layer 355 and the upper side of the second adhesive auxiliary layer 610 are made planar, thereby preventing the common electrode 270 positioned thereon from being short-circuited.

The common electrode 270 may be connected to the common voltage transmitter 27 through the opening 181 of the passivation layer 180. That is, the common electrode 270 may be positioned on the upper side of the common voltage transmitter 27 exposed by the opening 181 to contact each other. Therefore, the common electrode 270 may receive the common voltage (ELVSS) through the common voltage transmitter 27.

Although not shown, a sealing member may be positioned between the substrate 110 and the encapsulation substrate 210. The sealing member may be positioned in the peripheral area (PA). The sealing member may surround the display area (DA) in a plan view. Therefore, the light-emitting device (LED) positioned in the display area (DA) may be surrounded and sealed by the sealing member. The substrate 110 and the encapsulation substrate 210 may be bonded by the sealing member. The sealing member may be formed by applying a glass material such as a frit to the peripheral area (PA) between the substrate 110 and the encapsulation substrate 210, irradiating UV rays, and thereby curing the same.

A display device according to a reference example and a display device according to an embodiment will now be described with reference to FIG. 3 to FIG. 5.

Figure 3:
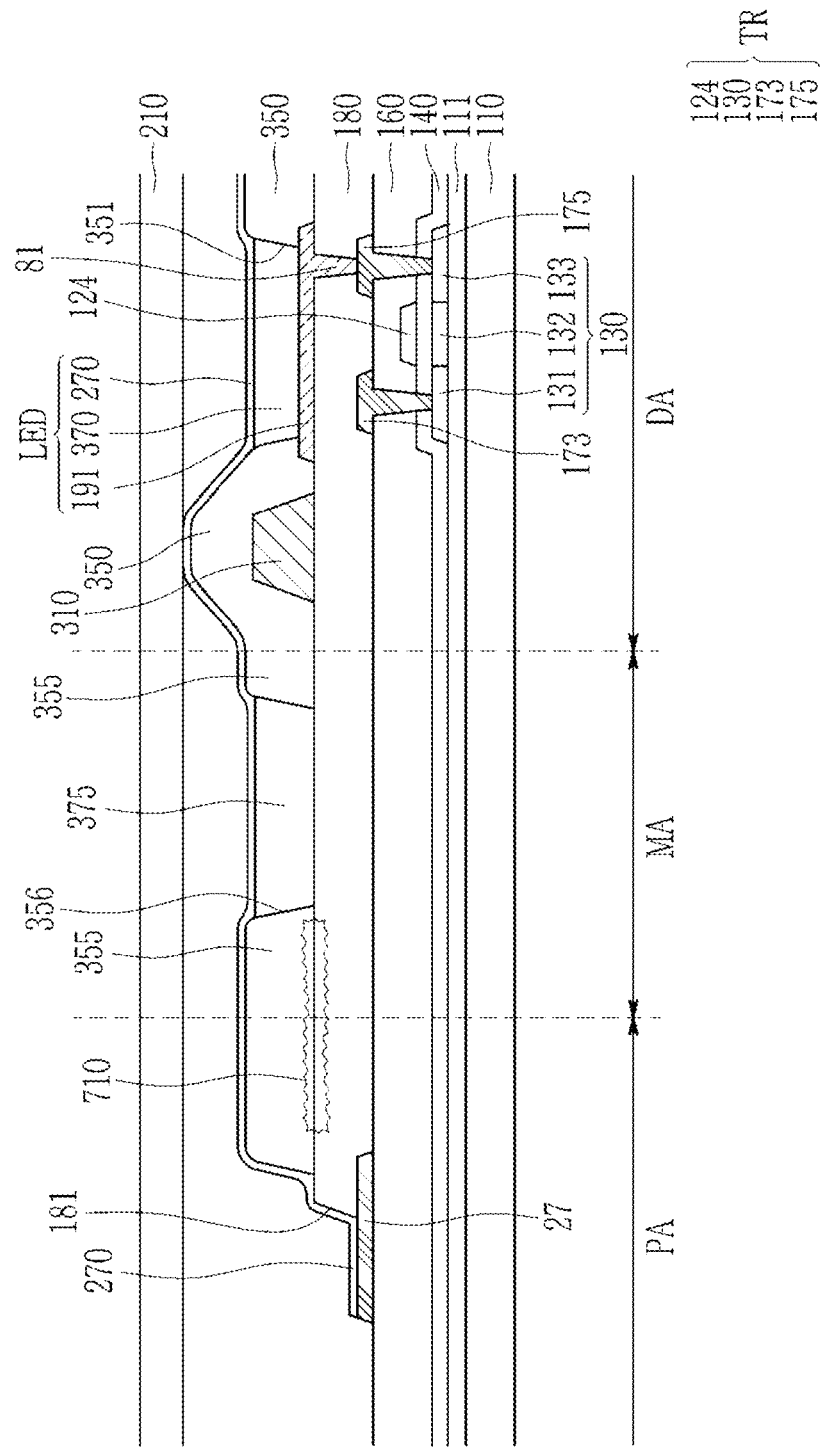
FIG. 3 shows a cross-sectional view of a display device according to a reference example.
Figure 4:
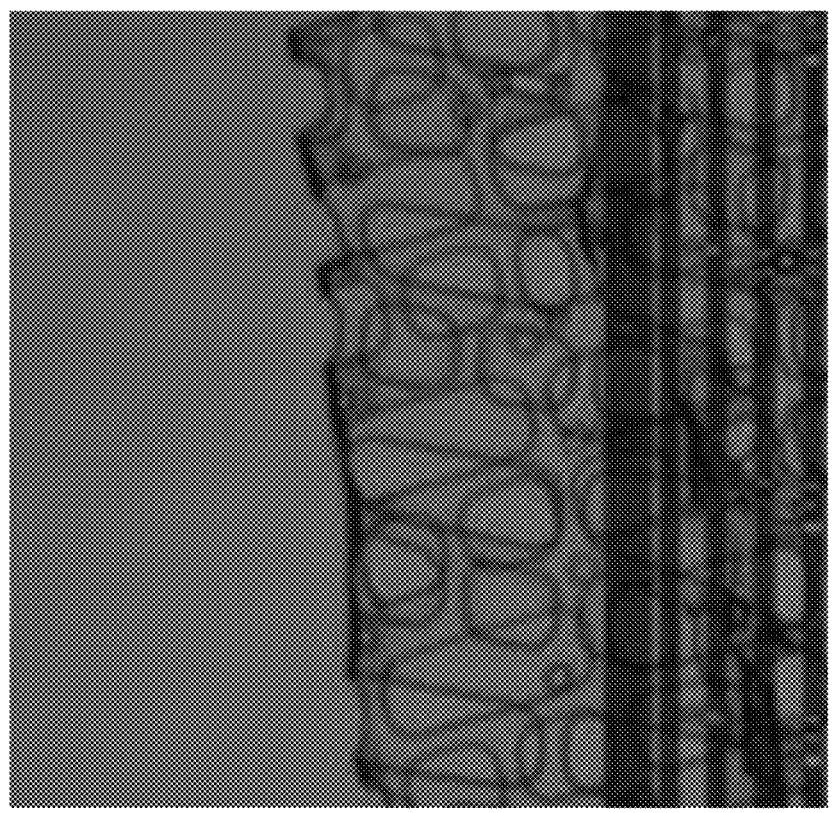
FIG. 4 shows a predetermined region of a display device according to a reference example.
Figure 5:
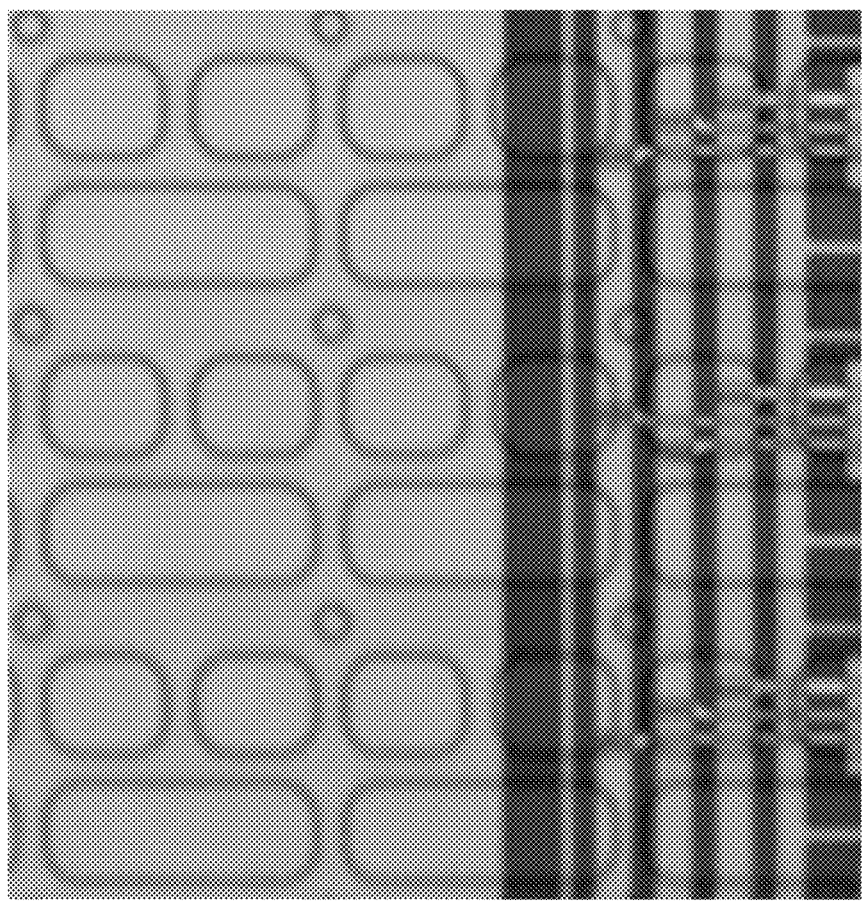
FIG. 5 shows a predetermined region of a display device according to an embodiment.

FIG. 3 shows a cross-sectional view of a display device according to a reference example, FIG. 4 shows a predetermined region of a display device according to a reference example, and FIG. 5 shows a predetermined region of a display device according to an embodiment.

As shown in FIG. 3, the display device according to a reference example does not include constituent elements corresponding to the first adhesive auxiliary layer 510 and the second adhesive auxiliary layer 610 of the display device according to an embodiment. Regarding the display device according to a reference example, a passivation layer 180 and a dummy pixel defining layer 355 are stacked in the dummy area (MA) and the peripheral area (PA) of the substrate 110. The dummy pixel defining layer 355 is positioned on the passivation layer 180, and they contact each other. The passivation layer 180 may include an organic insulating material. The dummy pixel defining layer 355 may include a hydrophobic material. Therefore, adherence between the dummy pixel defining layer 355 and the passivation layer 180 may be lowered, and a phenomenon 710 in which a space between the dummy pixel defining layer 355 and the passivation layer 180 lifts may be generated. Therefore, as shown in FIG. 4, a developer may permeate into a space between the dummy pixel defining layer 355 and the passivation layer 180 in a process for forming the dummy pixel defining layer 355.

The display device according to an embodiment includes a first adhesive auxiliary layer 510, and the first adhesive auxiliary layer 510 may include the same material as the pixel electrode 191. The first adhesive auxiliary layer 510 including a transparent conductive oxide film and/or a metal material is positioned between the passivation layer 180 and the dummy pixel defining layer 355 in the display device according to an embodiment, thereby improving adherence between the dummy pixel defining layer 355 and the passivation layer 180. As shown in FIG. 5, the dummy pixel may be normally formed by preventing the developer from permeating into the space between the dummy pixel defining layer 355 and the passivation layer 180 in the process for forming the dummy pixel defining layer 355.

A display device according to a reference example and a display device according to an embodiment will now be described with reference to FIG. 6 to FIG. 8.

Figure 6:
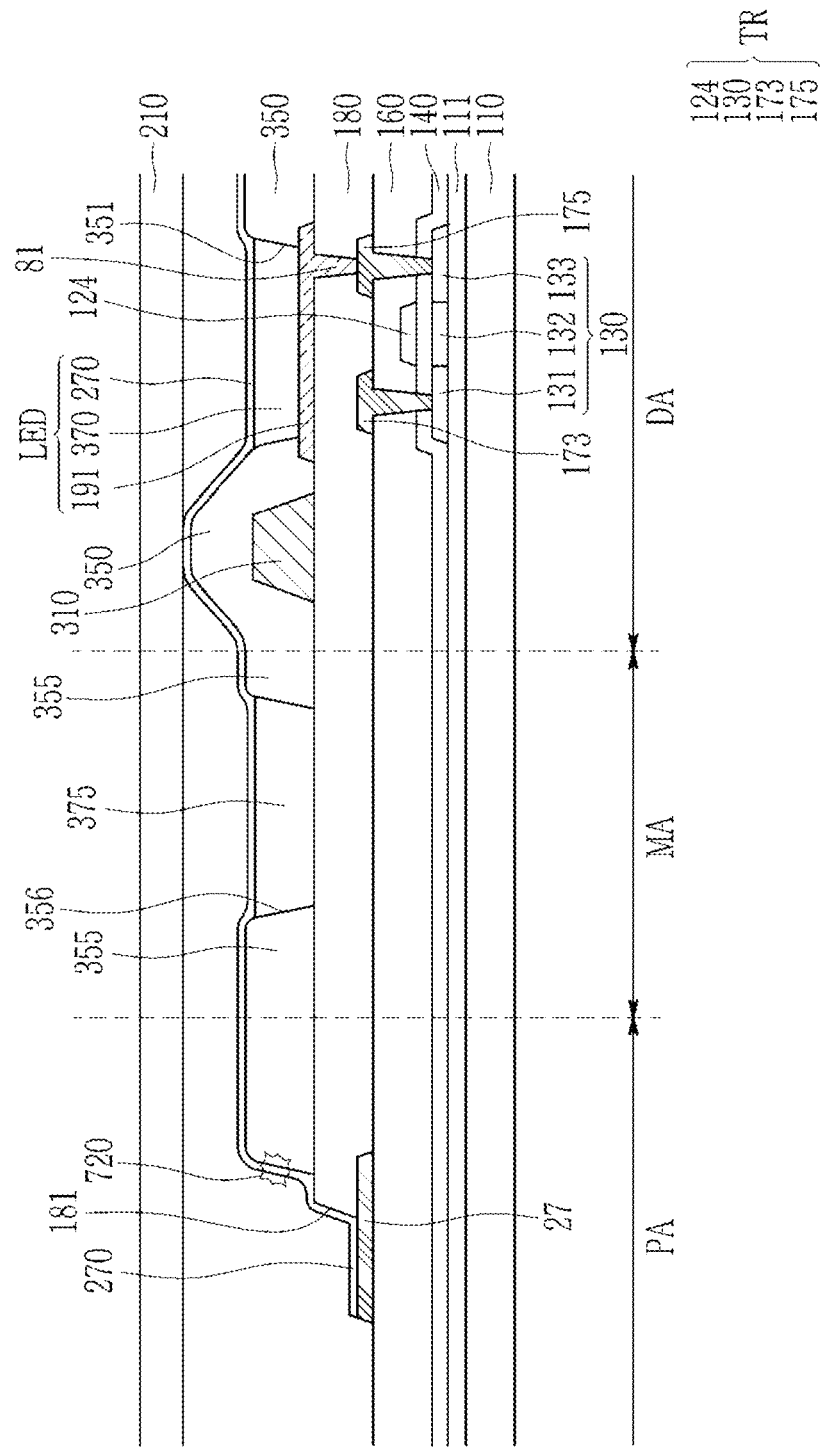
FIG. 6 shows a cross-sectional view of a display device according to a reference example.
Figure 7:
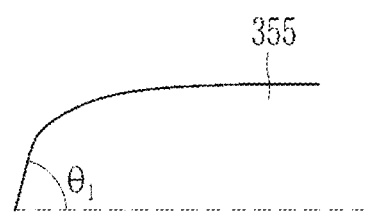
FIG. 7 shows a cross-sectional view of a predetermined layer of a display device according to a reference example.
Figure 8:
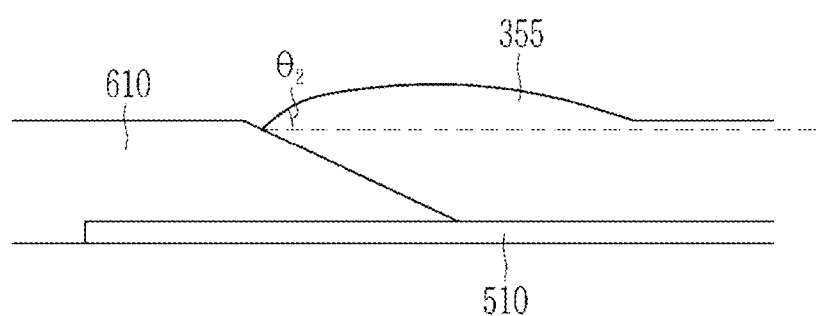
FIG. 8 shows a cross-sectional view of a predetermined layer of a display device according to an embodiment.

FIG. 6 shows a cross-sectional view of a display device according to a reference example, FIG. 7 shows a cross-sectional view of a predetermined layer of a display device according to a reference example, and FIG. 8 shows a cross-sectional view of a predetermined layer of a display device according to an embodiment.

As shown in FIG. 6, the display device according to a reference example does not include the constituent elements corresponding to the first adhesive auxiliary layer 510 and the second adhesive auxiliary layer 610 of the display device according to an embodiment. In the display device according to a reference example, a passivation layer 180 and a dummy pixel defining layer 355 are stacked in the dummy area (MA) and the peripheral area (PA) on the substrate 110. A common voltage transmitter 27 is positioned in the peripheral area (PA) of the substrate 110, and a passivation layer 180 may be positioned on the common voltage transmitter 27. The common electrode 270 connected to the common voltage transmitter 27 may be positioned on a lateral side and an upper side of the passivation layer 180, and a lateral side and an upper side of the dummy pixel defining layer 355. The dummy pixel defining layer 355 may be made of a negative photoresist. Therefore, as shown in FIG. 7, a taper angle $\theta_1$ of the lateral side, that is, the inclined side of the dummy pixel defining layer 355, may be formed to be high. A portion of the common electrode 270 positioned on the inclined side of the dummy pixel defining layer 355 with the high taper angle $\theta_1$ may generate a thin effective thickness to cause a short-circuit defect 720.

As shown in FIG. 8, the display device according to an embodiment includes the dummy pixel defining layer 355 and the second adhesive auxiliary layer 610, and a portion of the dummy pixel defining layer 355 may overlap a portion of the second adhesive auxiliary layer 610. The second adhesive auxiliary layer 610 may be made of a positive photoresist and may have a low taper angle. The dummy pixel defining layer 355 is positioned on the inclined side of the second adhesive auxiliary layer 610. In this instance, the taper angle $\theta_2$ of the dummy pixel defining layer 355 is lowered on the portion where the dummy pixel defining layer 355 overlaps the second adhesive auxiliary layer 610. Therefore, the upper side of the dummy pixel defining layer 355 and the upper side of the second adhesive auxiliary layer 610 may be near planar. Therefore, the common electrode 270 positioned on the dummy pixel defining layer 355 and the second adhesive auxiliary layer 610 may be prevented from being short-circuited. In addition, as the taper angle of the second adhesive auxiliary layer 610 is low, the common electrode 270 positioned on the inclined side of the second adhesive auxiliary layer 610 may be prevented from being short-circuited.

A display device according to an embodiment will now be described with reference to FIG. 9.

Many portions of the display device according to an embodiment shown in FIG. 9 correspond to those of the display device according to an embodiment described with reference to FIG. 1 and FIG. 2, so no identical portions will be described. In the present embodiment, the dummy pixel defining layer covers part of the upper side of the second adhesive auxiliary layer, which is different from the previous embodiment and will now be described.

Figure 9:
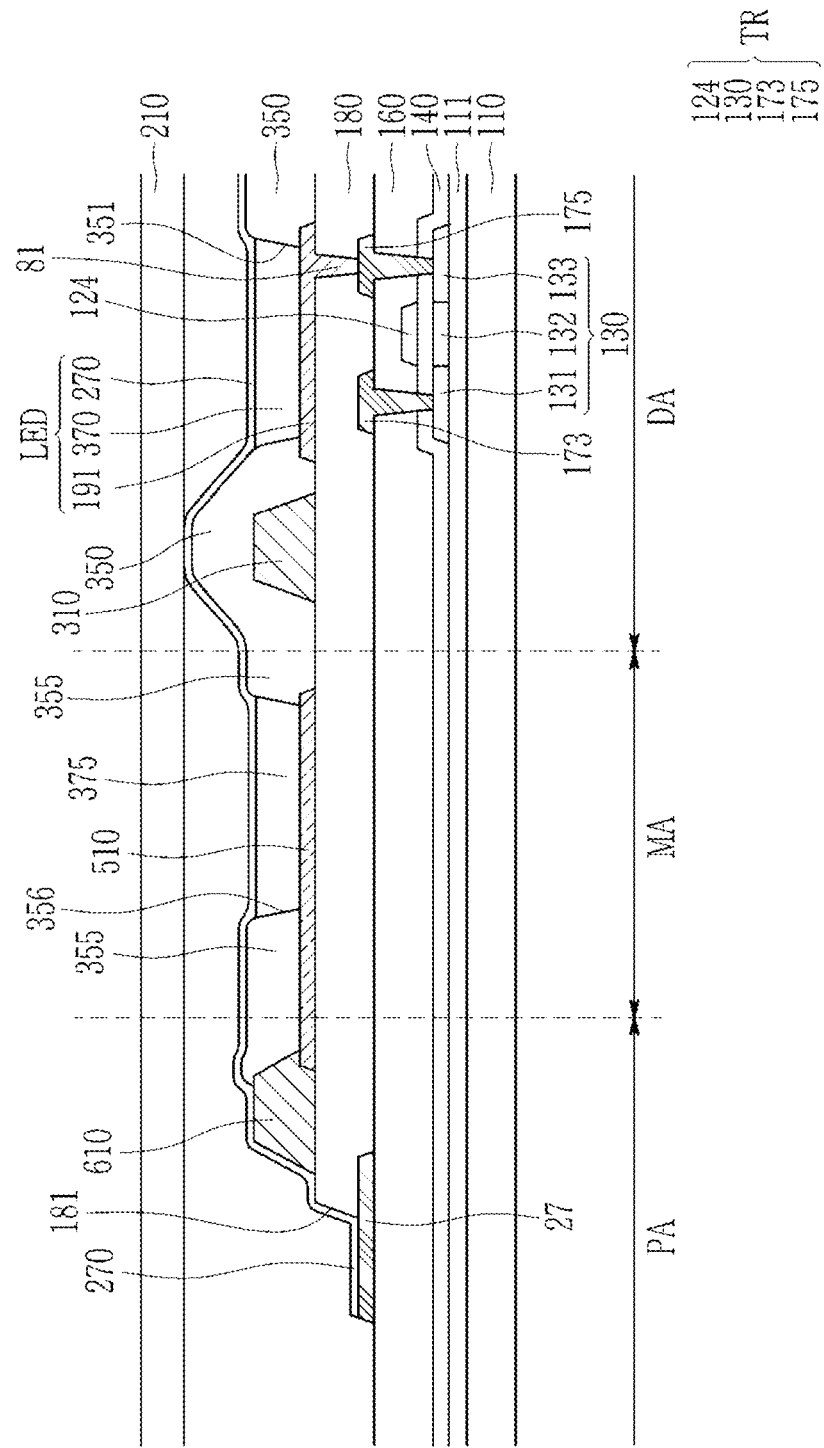
FIG. 9 shows a cross-sectional view of a display device according to an embodiment.

FIG. 9 shows a cross-sectional view of a display device according to an embodiment.

As shown in FIG. 9, the display device according to an embodiment may include a transistor (TR), a pixel electrode 191, a pixel defining layer 350, an emission layer 370, and a common electrode 270 positioned in the display area (DA) of the substrate 110. Further, a first adhesive auxiliary layer 510, a dummy pixel defining layer 355, a dummy emission layer 375, and a common electrode 270 may be positioned in the dummy area (MA) of the substrate 110. Further, a common voltage transmitter 27, a first adhesive auxiliary layer 510, a second adhesive auxiliary layer 610, and a dummy pixel defining layer 355 may be positioned in the peripheral area (PA) of the substrate 110.

In the present embodiment, the dummy pixel defining layer 355 may be provided to cover a portion of the upper side of the second adhesive auxiliary layer 610.

The second adhesive auxiliary layer 610 is formed, and the dummy pixel defining layer 355 is then formed, and in this instance, the dummy pixel defining layer 355 is positioned to contact the inclined side of the second adhesive auxiliary layer 610. It is advantageous in planarization of the upper sides of the dummy pixel defining layer 355 and the second adhesive auxiliary layer 610 to form the dummy pixel defining layer 355 to not cover the upper side of the second adhesive auxiliary layer 610. Further, it is advantageous in planarization of the upper sides of the dummy pixel defining layer 355 and the second adhesive auxiliary layer 610 to form the dummy pixel defining layer 355 to cover the most of the inclined side of the second adhesive auxiliary layer 610. At least part of the dummy pixel defining layer 355 may cover the upper side of the second adhesive auxiliary layer 610 in the process for forming the dummy pixel defining layer 355. In this instance, the dummy pixel defining layer 355 may cover part of the edge of the upper side of the second adhesive auxiliary layer 610. However, in this case, the upper sides of the dummy pixel defining layer 355 and the second adhesive auxiliary layer 610 become substantially planar, so the common electrode 270 positioned on the dummy pixel defining layer 355 and the second adhesive auxiliary layer 610 may be prevented from being short-circuited.

A display device according to an embodiment will now be described with reference to FIG. 10.

Many portions of the display device according to an embodiment shown in FIG. 10 correspond to those of the display device according to an embodiment shown in FIG. 1 and FIG. 2, so no same portions will be described. In the present embodiment, the first adhesive auxiliary layer includes an inorganic insulating material.

Figure 10:
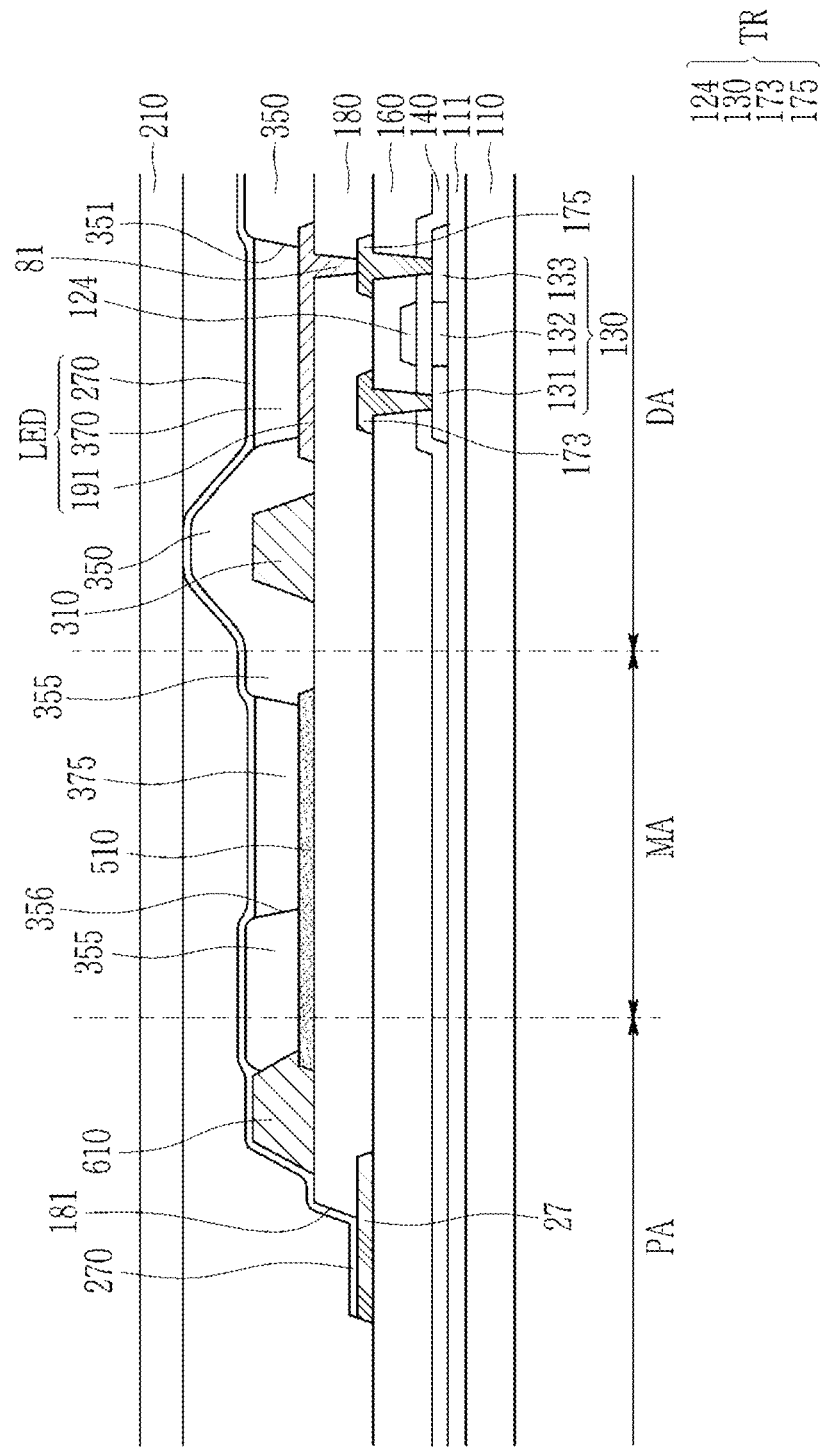
FIG. 10 shows a cross-sectional view of a display device according to an embodiment.

FIG. 10 shows a cross-sectional view of a display device according to an embodiment.

As shown in FIG. 10, the display device according to an embodiment may include a transistor (TR), a pixel electrode 191, a pixel defining layer 350, an emission layer 370, and a common electrode 270 positioned in the display area (DA) of the substrate 110. Further, a first adhesive auxiliary layer 510, a dummy pixel defining layer 355, a dummy emission layer 375, and a common electrode 270 may be positioned in the dummy area (MA) of the substrate 110. In addition, a common voltage transmitter 27, a first adhesive auxiliary layer 510, a second adhesive auxiliary layer 610, and a dummy pixel defining layer 355 may be positioned in the peripheral area (PA) of the substrate 110.

The first adhesive auxiliary layer 510 may include the same material as the pixel electrode 191 in the previous embodiment, and the first adhesive auxiliary layer 510 may include a material that is different from the pixel electrode 191 in the present embodiment.

The first adhesive auxiliary layer 510 may be positioned on the passivation layer 180. An inorganic insulating material such as a silicon nitride (SiNx), a silicon oxide (SiOx), or a silicon oxynitride (SiOxNy) may be formed on the passivation layer 180, and it may be patterned to form a first adhesive auxiliary layer 510. The first adhesive auxiliary layer 510 may be a single layer or multi-layered structure of the material. That is, the first adhesive auxiliary layer 510 may be formed by a process that is different from the pixel electrode 191. The first adhesive auxiliary layer 510 may be positioned in the dummy area (MA) and the peripheral area (PA) of the substrate 110, and it may not be positioned in the display area (DA).

The dummy pixel defining layer 355 may be positioned on the first adhesive auxiliary layer 510. The first adhesive auxiliary layer 510 is made of an inorganic insulating material, thereby improving the adherence between the passivation layer 180 and the dummy pixel defining layer 355.

A display device according to an embodiment will now be described with reference to FIG. 11.

Many portions of the display device according to an embodiment shown in FIG. 11 correspond to those of the display device according to an embodiment shown in FIG. 10, so no same portions will be described. In the present embodiment, the adhesive auxiliary layer includes an inorganic insulating material.

Figure 11:
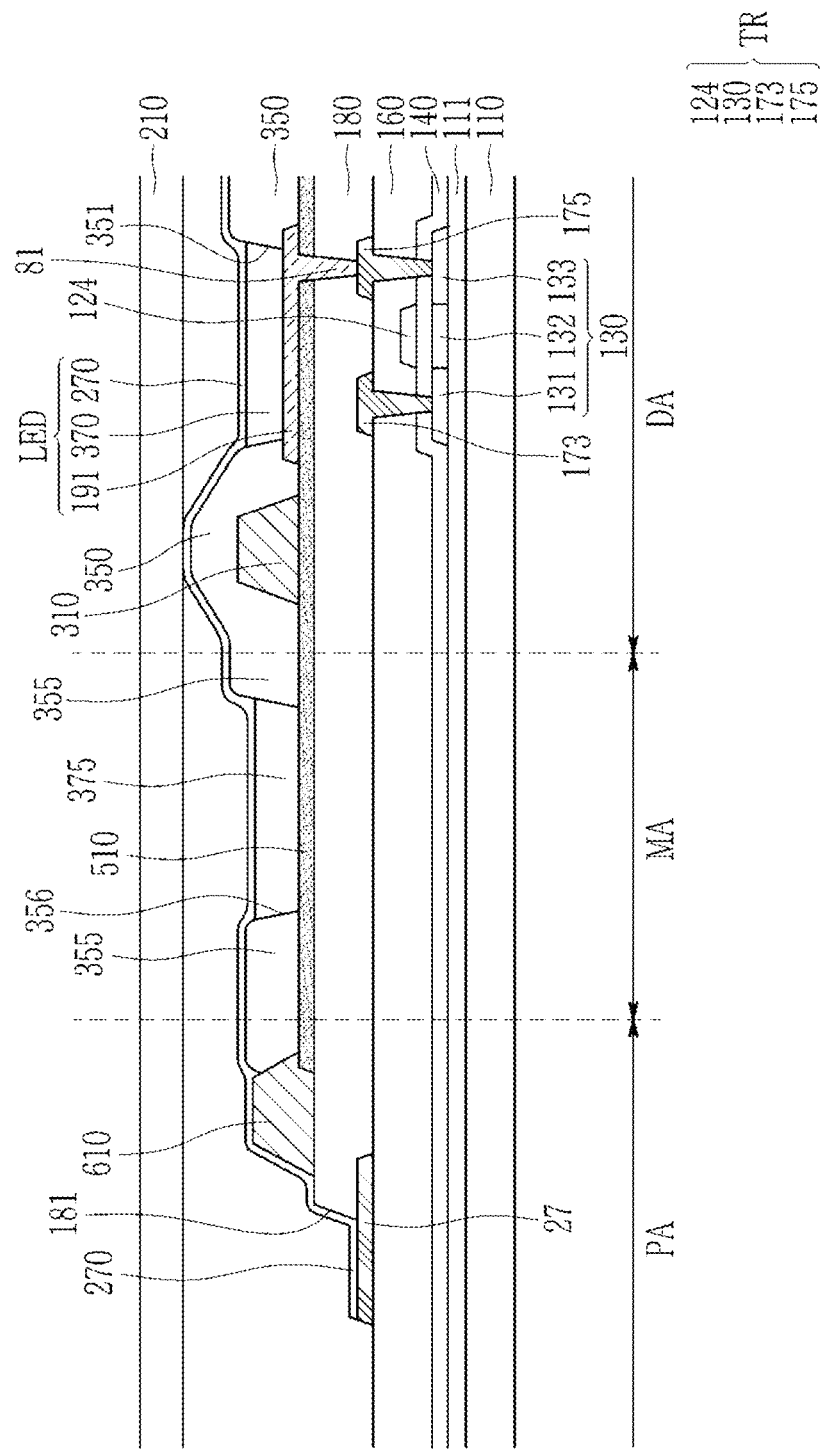
FIG. 11 shows a cross-sectional view of a display device according to an embodiment.

FIG. 11 shows a cross-sectional view of a display device according to an embodiment.

As shown in FIG. 11, the display device according to an embodiment may include a transistor (TR), a pixel electrode 191, a pixel defining layer 350, an emission layer 370, and a common electrode 270 positioned in the display area (DA) of the substrate 110. Further, a first adhesive auxiliary layer 510, a dummy pixel defining layer 355, a dummy emission layer 375, and a common electrode 270 may be positioned in the dummy area (MA) of the substrate 110. In addition, a common voltage transmitter 27, a first adhesive auxiliary layer 510, a second adhesive auxiliary layer 610, and a dummy pixel defining layer 355 may be positioned in the peripheral area (PA) of the substrate 110.

In the previous embodiment (FIG. 10), the first adhesive auxiliary layer 510 may be positioned in the dummy area (MA) and the peripheral area (PA) of the substrate 110, and it may not be positioned in the display area (DA). In the present embodiment (FIG. 11), the first adhesive auxiliary layer 510 may be positioned to extend to the display area (DA) of the substrate 110. That is, the first adhesive auxiliary layer 510 may be positioned in the display area (DA), the dummy area (MA), and the peripheral area (PA) of the substrate 110.

The first adhesive auxiliary layer 510 may be positioned on the passivation layer 180, and may have substantially the same planar shape as the passivation layer 180. The passivation layer 180 includes a via-hole 81 overlapping the drain electrode 175. The via-hole 81 may also be formed in the first adhesive auxiliary layer 510. A portion in which the first adhesive auxiliary layer 510 does not overlap the second adhesive auxiliary layer 610 is positioned in the peripheral area (PA) of the substrate 110. It is, however, not limited thereto, and the first adhesive auxiliary layer 510 may extend to overlap the second adhesive auxiliary layer 610 in the peripheral area (PA). The passivation layer 180 and the first adhesive auxiliary layer 510 may be sequentially stacked and may be simultaneously patterned to form a via-hole 81 and an opening 181.

A display device according to an embodiment will now be described with reference to FIG. 12.

Many portions of the display device according to an embodiment shown in FIG. 12 correspond to those of the display device according to an embodiment shown in FIG. 1 and FIG. 2, so no same portions will be described. In the present embodiment, the passivation layer includes a first passivation layer and a second passivation layer, and the second adhesive auxiliary layer includes the same material as the second passivation layer.

Figure 12:
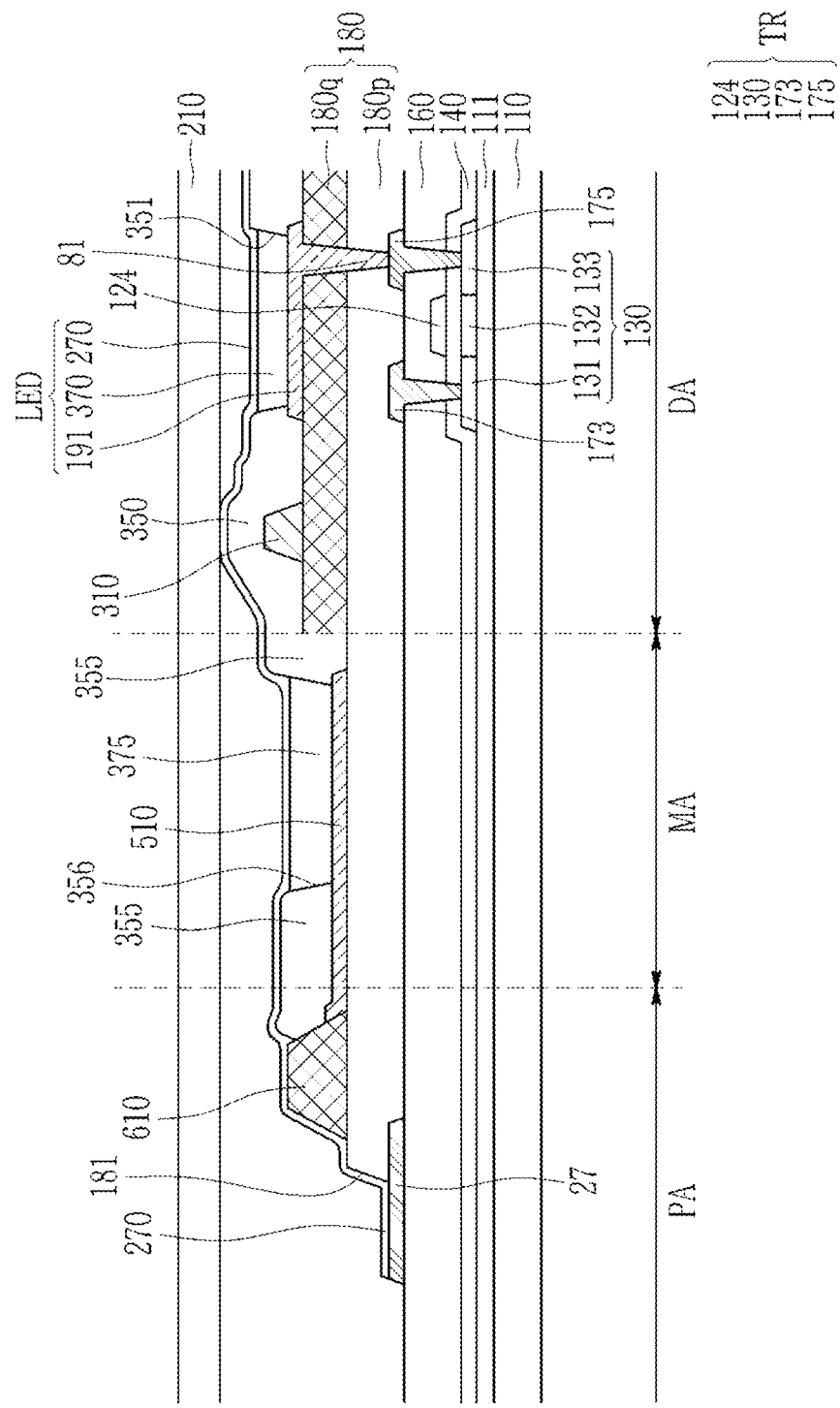
FIG. 12 shows a cross-sectional view of a display device according to an embodiment.

FIG. 12 shows a cross-sectional view of a display device according to an embodiment.

As shown in FIG. 12, the display device according to an embodiment may include a transistor (TR), a pixel electrode 191, a pixel defining layer 350, an emission layer 370, and a common electrode 270 positioned in the display area (DA) of the substrate 110. Further, a first adhesive auxiliary layer 510, a dummy pixel defining layer 355, a dummy emission layer 375, and a common electrode 270 may be positioned in the dummy area (MA) of the substrate 110. In addition, a common voltage transmitter 27, a first adhesive auxiliary layer 510, a second adhesive auxiliary layer 610, and a dummy pixel defining layer 355 may be positioned in the peripheral area (PA) of the substrate 110.

In the previous embodiment (FIG. 11), the second adhesive auxiliary layer 610 may include the same material as the spacer 310, and in the present embodiment (FIG. 12), the passivation layer 180 may include a first passivation layer 180p and a second passivation layer 180q, while the second adhesive auxiliary layer 610 may include the same material as the second passivation layer 180q.

The passivation layer 180 may include a first passivation layer 180p positioned on the thin film transistor (TR), and a second passivation layer 180q positioned on the first passivation layer 180p. The first passivation layer 180p may be positioned in the display area (DA) and the dummy area (MA) of the substrate 110. The first passivation layer 180p may be positioned in the peripheral area (PA) of the substrate 110, and may be patterned to not overlap at least part of the common voltage transmitter 27. The second passivation layer 180q may be positioned on the first passivation layer 180p, and may be patterned in a similar way as the first passivation layer 180p. The second passivation layer 180q may be patterned in substantially the same way as the first passivation layer 180p. The second passivation layer 180q may not be positioned in the dummy area (MA). It is, however, not limited thereto, and the second passivation layer 180q may be positioned on the first passivation layer 180p in the dummy area (MA). The second passivation layer 180q may be positioned to overlap the pixel electrode 191 and the spacer 310. The pixel electrode 191 and the spacer 310 may be positioned on the second passivation layer 180q. The first passivation layer 180p and the second passivation layer 180q may be formed by the same process or by different processes. The second passivation layer 180q may be further positioned on the first passivation layer 180p to further planarize the upper side of the passivation layer 180. Therefore, the upper side of the pixel electrode 191 positioned on the passivation layer 180 may be formed to be planar, and reflectance of external light may be reduced.

The second adhesive auxiliary layer 610 may be positioned on the first passivation layer 180p of the passivation layer 180. The second adhesive auxiliary layer 610 may include the same material as the second passivation layer

180q of the passivation layer 180. The second passivation layer 180q and the second adhesive auxiliary layer 610 may include an organic material such as polyimide, acryl resin, or an epoxy-based organic polymer. The second passivation layer 180q and the second adhesive auxiliary layer 610 may be made of a positive photoresist. The second adhesive auxiliary layer 610 may be positioned on the same layer as the second passivation layer 180q, and may be formed according to the same process.

The pixel electrode 191 may be positioned on the second passivation layer 180q. Therefore, the first adhesive auxiliary layer 510 positioned on the same layer as the pixel electrode 191 may be positioned on the second adhesive auxiliary layer 610 positioned on the same layer as the second passivation layer 180q. In this instance, the second adhesive auxiliary layer 610 may be positioned on the lateral side of the first adhesive auxiliary layer 510, that is, on the inclined side. The second adhesive auxiliary layer 610 may not be positioned on the upper side of the first adhesive auxiliary layer 510. This is, however, not limited thereto, and depending on cases, the second adhesive auxiliary layer 610 may be further positioned on the upper side of the first adhesive auxiliary layer 510.

A display device according to an embodiment will now be described with reference to FIG. 13.

Many portions of the display device according to an embodiment shown in FIG. 13 correspond to those of the display device according to an embodiment shown in FIG. 12, so no same portions will be described. In the present embodiment, the encapsulation substrate is omitted, and an encapsulation layer is formed.

Figure 13:
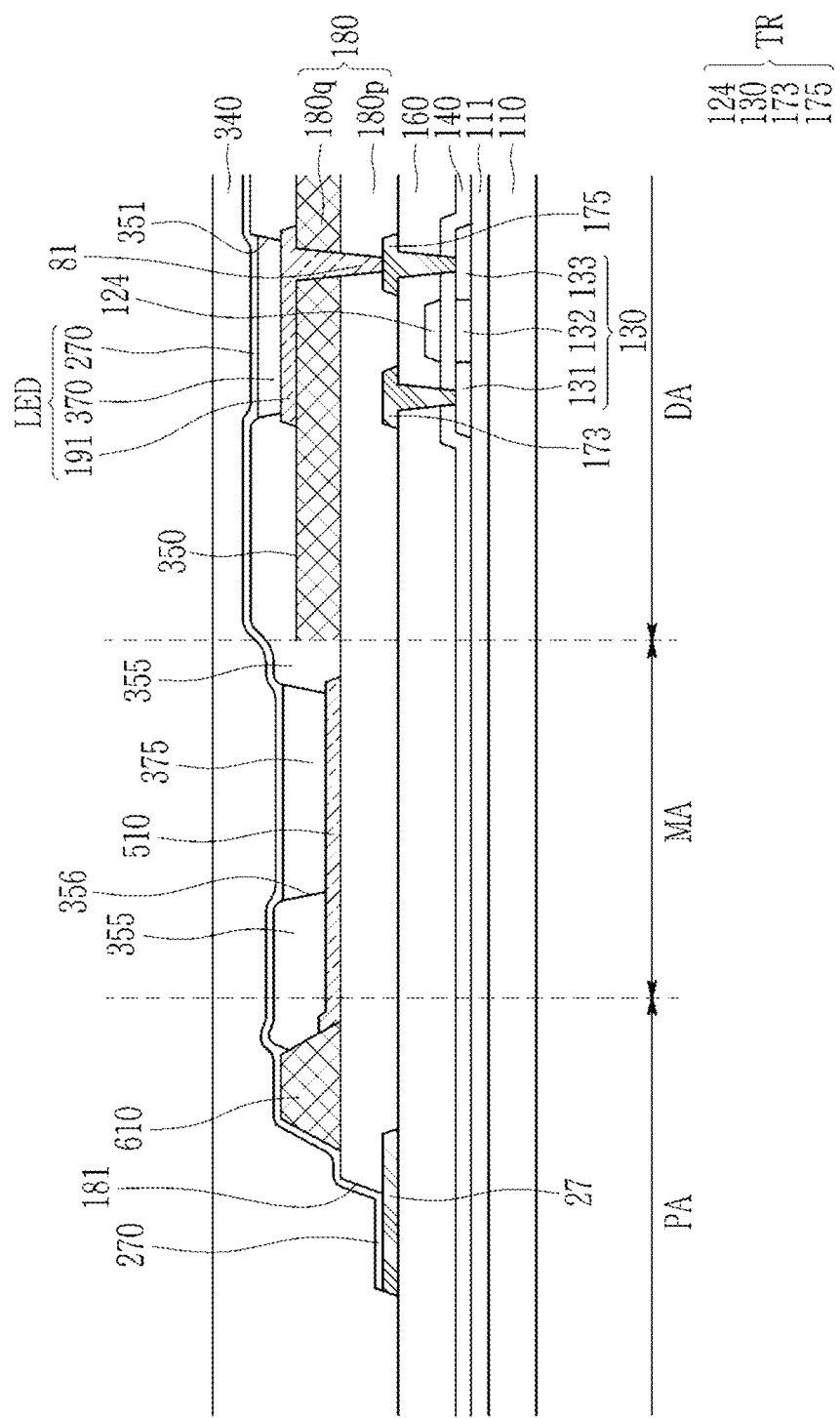
FIG. 13 shows a cross-sectional view of a display device according to an embodiment.

FIG. 13 shows a cross-sectional view of a display device according to an embodiment.

As shown in FIG. 13, the display device according to an embodiment may include a transistor (TR), a pixel electrode 191, a pixel defining layer 350, an emission layer 370, and a common electrode 270 positioned in the display area (DA) of the substrate 110. Further, a first adhesive auxiliary layer 510, a dummy pixel defining layer 355, a dummy emission layer 375, and a common electrode 270 may be positioned in the dummy area (MA) of the substrate 110. Further, a common voltage transmitter 27, a first adhesive auxiliary layer 510, a second adhesive auxiliary layer 610, and a dummy pixel defining layer 355 may be positioned in the peripheral area (PA) of the substrate 110.

The substrate 110 may be positioned to face the encapsulation substrate 210, a spacer 310 may be positioned between the substrate 110 and the encapsulation substrate 210 in the previous embodiment, and the encapsulation substrate 210 and the spacer 310 may be omitted in the present embodiment.

An encapsulation layer 340 may be positioned on the common electrode 270 instead of omitting the encapsulation substrate 210 and the spacer 310. The encapsulation layer 340 may include at least one inorganic film and at least one organic film. For example, the encapsulation layer 340 may include a first inorganic encapsulation layer, an organic film encapsulation layer, and a second inorganic encapsulation layer. This is, however, an example, and a number of inorganic films and organic films configuring the encapsulation layer 340 is modifiable in many ways. The encapsulation layer 340 protects the light-emitting device (LED) from moisture or oxygen that may be input from the outside.

A display device according to an embodiment will now be described with reference to FIG. 14.

Many portions of the display device according to an embodiment shown in FIG. 14 correspond to those of the display device according to an embodiment shown in FIG. 13, so no same portions will be described. In the present embodiment, the passivation layer is made into a single layer.

Figure 14:
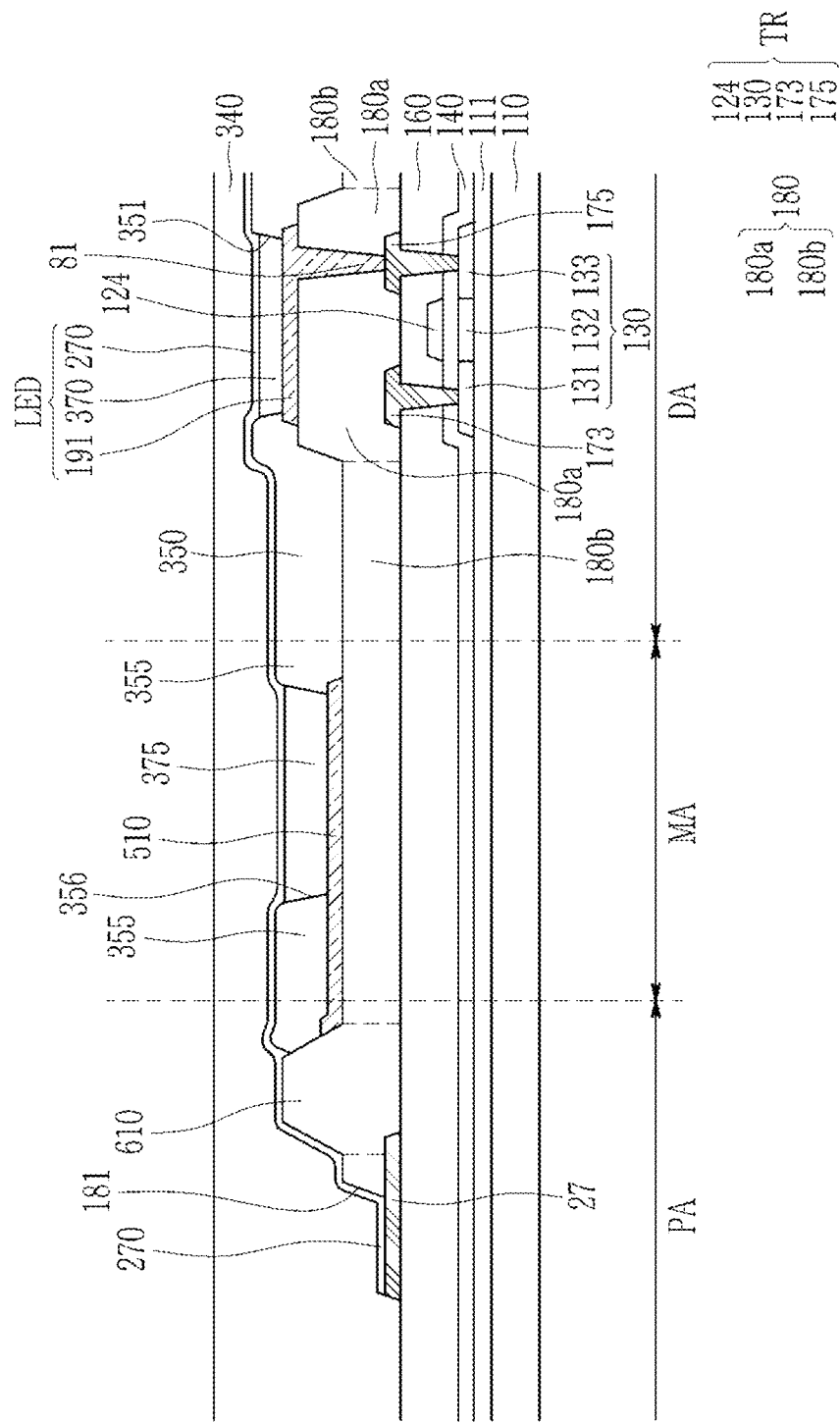
FIG. 14 shows a cross-sectional view of a display device according to an embodiment.

FIG. 14 shows a cross-sectional view of a display device according to an embodiment.

As shown in FIG. 14, the display device according to an embodiment may include a transistor (TR), a pixel electrode 191, a pixel defining layer 350, an emission layer 370, and a common electrode 270 positioned in the display area (DA) of the substrate 110. Further, a first adhesive auxiliary layer 510, a dummy pixel defining layer 355, a dummy emission layer 375, and a common electrode 270 may be positioned in the dummy area (MA) of the substrate 110. In addition, a common voltage transmitter 27, a first adhesive auxiliary layer 510, a second adhesive auxiliary layer 610, and a dummy pixel defining layer 355 may be positioned in the peripheral area (PA) of the substrate 110.

The passivation layer 180 may include a first passivation layer 180p and a second passivation layer 180q in the previous embodiment, and the passivation layer 180 may be made of a single layer in the present embodiment.

The passivation layer 180 may be made into a single layer and may be formed to have different thicknesses depending on the position. Therefore, the passivation layer 180 according to the present embodiment may have substantially the same shape as the passivation layer 180 according to the previous embodiment including the first passivation layer 180p and the second passivation layer 180q. In the present embodiment, the passivation layer 180 may be formed to have different thicknesses by using a halftone mask and a slit mask.

The passivation layer 180 may include a first portion 180a and a second portion 180b having different thicknesses. The first portion 180a of the passivation layer 180 may be formed to be thicker than the second portion 180b. The first portion 180a of the passivation layer 180 may overlap the pixel electrode 191. The first portion 180a of the passivation layer 180 may be formed to be wider than the pixel electrode 191. Therefore, the edge of the first portion 180a of the passivation layer 180 may overlap the edge of the pixel defining layer 350, and may not overlap the center portion of the pixel defining layer 350. By forming the first portion 180a of the passivation layer 180 to be relatively thick and positioning the pixel electrode 191 on the first portion 180a, the upper side of the pixel electrode 191 may be formed to be planar, and the reflectance of external light may be reduced.

The second adhesive auxiliary layer 610 may include the same material as the passivation layer 180. The second adhesive auxiliary layer 610 may be positioned on the same layer as the passivation layer 180, and may be formed according to the same process. One region of the second adhesive auxiliary layer 610 may have the same thickness as the first portion 180a of the passivation layer 180, and the other region may have the same thickness as the second portion 180b of the passivation layer 180. A dummy pixel defining layer 355 may be positioned on the lateral side, that is, the inclined side, of the portion of the second adhesive auxiliary layer 610 having the same thickness as the first portion 180a of the passivation layer 180. Further, a first adhesive auxiliary layer 510 may be positioned on the lateral side, that is, the inclined side of the portion of the second adhesive auxiliary layer 610 having the same thickness as the first portion 180a of the passivation layer 180.

While this disclosure has been described in connection with what is presently considered to be practical embodiments, it is to be understood that the invention is not limited to the disclosed embodiments, but, on the contrary, is intended to cover various modifications and equivalent arrangements included within the scope of the appended claims.

What is claimed is:

1. A display device comprising:
a substrate including a display area, a dummy area, and a peripheral area;
a passivation layer positioned in the display area, the dummy area, and the peripheral area of the substrate;
a first adhesive auxiliary layer positioned on the passivation layer and positioned in the dummy area;
a dummy pixel defining layer positioned on the first adhesive auxiliary layer and including a hydrophobic material;
a second adhesive auxiliary layer positioned on the passivation layer, positioned in the peripheral area, and including a lateral side directly contacting the dummy pixel defining layer;
a common voltage transmitter positioned in the peripheral area; and
a common electrode electrically connected to the common voltage transmitter, and positioned on a side of the second adhesive auxiliary layer opposite to the dummy pixel defining layer.

2. The display device of claim 1, wherein
the second adhesive auxiliary layer is made of a positive photoresist, and
the dummy pixel defining layer is made of a negative photoresist.

3. The display device of claim 1, wherein
the dummy pixel defining layer is positioned on the lateral side of the second adhesive auxiliary layer, and is not positioned on an upper side of the second adhesive auxiliary layer.

4. The display device of claim 1, wherein
the dummy pixel defining layer overlaps an edge of an upper side of the second adhesive auxiliary layer.

5. The display device of claim 1, wherein
an overlapping width of the dummy pixel defining layer and the second adhesive auxiliary layer is equal to or greater than 2 μm.

6. The display device of claim 1, further comprising:
an encapsulation substrate facing the substrate; and
a spacer positioned between the substrate and the encapsulation substrate,
wherein the second adhesive auxiliary layer includes the same material as the spacer.

7. The display device of claim 6, wherein
the second adhesive auxiliary layer is positioned on a same layer as the spacer, and the second adhesive auxiliary layer is formed by a same process as the spacer.

8. The display device of claim 1, further comprising:
a transistor positioned in a display area of the substrate; and
a pixel electrode connected to the transistor and positioned in the display area,
wherein the first adhesive auxiliary layer include a same material as the pixel electrode, and
the first adhesive auxiliary layer extends to the peripheral area and is positioned below the second adhesive auxiliary layer.

9. The display device of claim 8, wherein
the first adhesive auxiliary layer is positioned on a same layer as the pixel electrode, and the first adhesive auxiliary layer is formed by a same process as the pixel electrode.

10. The display device of claim 8, further comprising
a pixel defining layer positioned on the pixel electrode and the passivation layer and including a pixel opening,
wherein the dummy pixel defining layer includes the same material as the pixel defining layer.

11. The display device of claim 10, further comprising
an emission layer positioned in the pixel opening,
wherein a dummy emission layer includes a same material as the emission layer.

12. The display device of claim 11, wherein
the emission layer is formed by a same inkjet printing process as the dummy emission layer.

13. The display device of claim 8, wherein
the transistor includes:
a semiconductor positioned on the substrate;
a gate electrode overlapping the semiconductor; and
a source electrode and a drain electrode positioned on the gate electrode and connected to the semiconductor, and
the common voltage transmitter includes a same material as the source electrode and the drain electrode.

14. The display device of claim 1, wherein
the common electrode is positioned on a lateral side of the passivation layer and the lateral side of the second adhesive auxiliary layer.

15. The display device of claim 1, wherein
the first adhesive auxiliary layer includes an inorganic insulating material.

16. The display device of claim 1, further comprising:
a transistor positioned in a display area of the substrate; and
a pixel electrode connected to the transistor and positioned in the display area,
wherein the first adhesive auxiliary layer extends to the display area and is positioned below the pixel electrode.

17. The display device of claim 1, wherein
the passivation layer includes a first passivation layer and a second passivation layer positioned on the first passivation layer,
the second adhesive auxiliary layer is positioned on the first passivation layer, and
the second adhesive auxiliary layer is positioned on a same layer as the second passivation layer.

18. The display device of claim 1, further comprising
an encapsulation layer positioned on the common electrode.

19. The display device of claim 1, wherein
the passivation layer includes a first portion and a second portion with different thicknesses,
the first portion of the passivation layer is thicker than the second portion, the second adhesive auxiliary layer is positioned on a same layer as the passivation layer, and
the dummy pixel defining layer is positioned on an inclined side of a portion of the second adhesive auxiliary layer with a same thickness as the first portion of the passivation layer.

20. A display device comprising:
a substrate including a display area, a dummy area, and a peripheral area;
a transistor positioned in the display area of the substrate;
a pixel electrode connected to the transistor and positioned in the display area;

a passivation layer positioned between the transistor and the pixel electrode, and positioned in the display area, the dummy area, and the peripheral area;

a pixel defining layer positioned on the pixel electrode and the passivation layer and including a pixel opening;

an emission layer positioned in the pixel opening;

a first adhesive auxiliary layer positioned on the passivation layer and positioned in the dummy area and the peripheral area;

a dummy pixel defining layer positioned on the first adhesive auxiliary layer and including a dummy pixel opening;

a dummy emission layer positioned in the dummy pixel opening;

a second adhesive auxiliary layer positioned on the passivation layer and the first adhesive auxiliary layer, and including a lateral side directly contacting the dummy pixel defining layer;

a common voltage transmitter positioned in the peripheral area; and a common electrode electrically connected to the common voltage transmitter, and positioned on, the dummy pixel defining layer, the dummy emission layer, the pixel defining layer, the emission layer, and a side of the second adhesive auxiliary layer opposite to the dummy pixel defining layer.

21. The display device of claim 20, wherein
the dummy pixel defining layer includes a hydrophobic material and is made of a negative photoresist, and
the second adhesive auxiliary layer is made of a positive photoresist.

22. The display device of claim 20, further comprising:
an encapsulation substrate facing the substrate; and
a spacer positioned between the substrate and the encapsulation substrate,
wherein the second adhesive auxiliary layer includes a same material as the spacer, and
the first adhesive auxiliary layer includes a same material as the pixel electrode.

* * * * *